United States Patent [19]

Norton

[11] Patent Number: 5,422,475
[45] Date of Patent: Jun. 6, 1995

[54] METHOD AND APPARATUS FOR CONCENTRATING OPTICAL FLUX IN A FOCAL PLANE ARRAY

[75] Inventor: Paul R. Norton, Santa Barbara, Calif.

[73] Assignee: Santa Barabara Research Center, Goleta, Calif.

[21] Appl. No.: 393,338

[22] Filed: Aug. 11, 1989

[51] Int. Cl.[6] ................................................. H01J 3/14
[52] U.S. Cl. ................................. 250/216; 250/338.4; 250/332
[58] Field of Search ....................... 250/216, 338.4, 332

[56] References Cited

U.S. PATENT DOCUMENTS 4,410,804  10/1983  Stauffer ........................... 250/216 X
4,667,092  5/1987  Ishihara ............................... 250/216

Primary Examiner—Mark Hellner
Attorney, Agent, or Firm—W. C. Schubert; W. K. Denson-Low

[57] ABSTRACT

A back side illuminated focal plane array (10,20) includes a plurality of radiation detectors (12,26) disposed upon a front surface of the array and further includes a plurality of optical flux concentrating structures (16,22) integrally formed upon or within a back, radiation receiving, surface of the array. Each of the flux concentrating structures is in registration with at least one of the radiation detectors for concentrating optical flux thereon. A method of the invention includes the steps of providing a substrate 30 and preparing a surface of the substrate such that the surface has a faster lateral etch rate than a vertical etch rate when exposed to an etchant. The method further includes a step of providing a mask 32 over the surface of the substrate, the mask having a plurality of openings therethrough individual ones of which are located at a position where a lens element is desired. The method further includes the steps of applying an etchant to the surface of the substrate through the openings within the mask, etching the surface of the substrate such that a plurality of depressions 34 are formed within the surface and depositing a layer 36 of material over the surface of the substrate such that the depressions are filled with the material. The method includes an additional step of removing excess material from the surface of the substrate, the material remaining within each of the depressions forming a lens element.

13 Claims, 1 Drawing Sheet

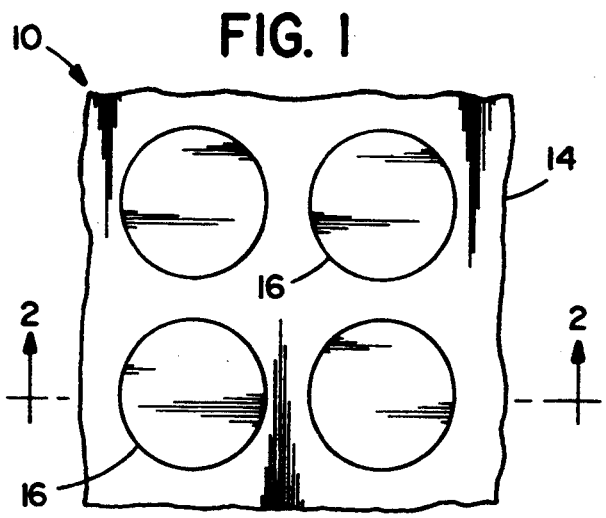
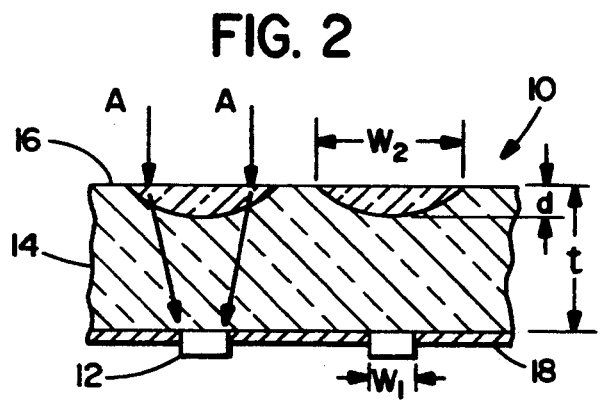
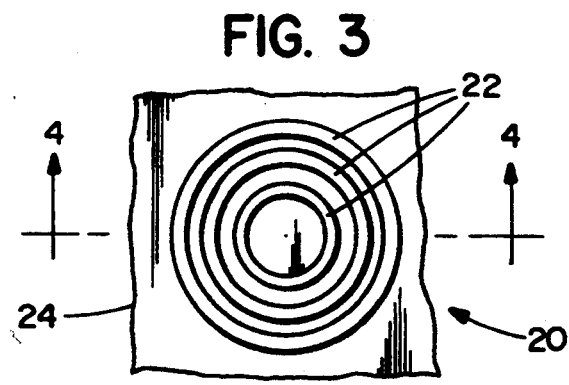
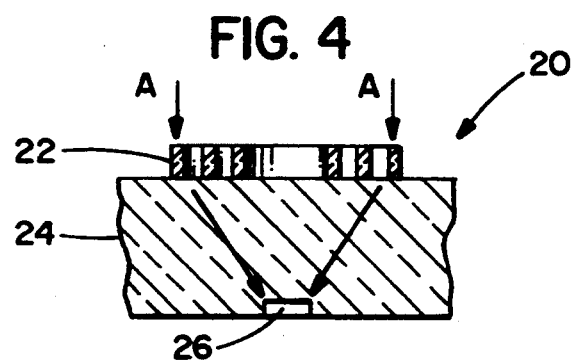
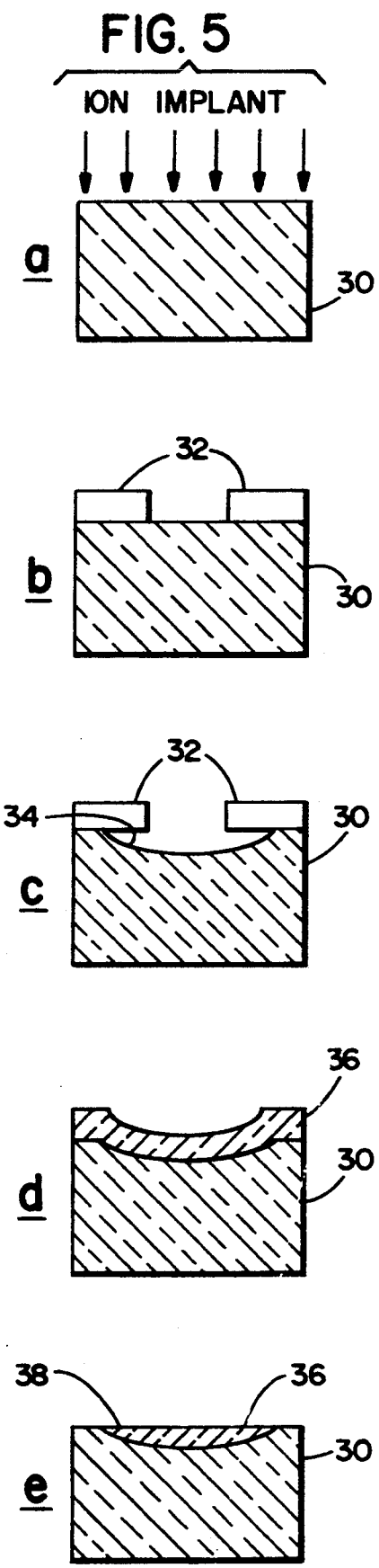

METHOD AND APPARATUS FOR CONCENTRATING OPTICAL FLUX IN A FOCAL PLANE ARRAY

FIELD OF THE INVENTION

This invention relates generally to a focal plane array (FPA) of radiation detectors and, in particular, to an Infra-red Radiation (IR) responsive back side illuminated FPA having a plurality of IR flux concentrating structures integrally formed on or within a back surface of the array, each of the detectors of the array having an associated flux concentrating structure.

BACKGROUND OF THE INVENTION

In a focal plane array of radiation detectors it is often desirable to reduce the area of the individual detectors. This reduction in area beneficially reduces device capacitance, hence increasing the speed, and also serves to make the individual detectors less sensitive to external ionizing radiation.

One problem associated with reduced area detectors is that the detector sensitivity is typically also reduced. A corresponding decrease in array fill factor is also experienced.

It is therefore one object of the invention to provide an array of radiation detectors of reduced area while increasing the amount of flux incident on each of the detectors.

It is a another object of the invention to provide a backside illuminated focal plane array of radiation detectors having detectors of reduced area and a fill factor of approximately 100 per cent.

It is another object of the invention to provide a backside illuminated focal plane array of radiation detectors having a plurality of optical flux concentrating structures integrally formed on a back surface thereof.

It is still another object of the invention to provide a focal plane array of radiation detectors and methods of fabricating same which provides for the fabrication of a plurality of lens elements on a back surface of the array, each of the lens elements being in registration with a corresponding photodetector.

SUMMARY OF THE INVENTION

The foregoing problems are overcome and other advantages are realized by a focal plane array of radiation detectors constructed in accordance with the invention. In accordance with one aspect of the invention there is disclosed a back side illuminated focal plane array which includes a plurality of radiation detectors disposed upon a front surface of the array and which further includes a plurality of optical flux concentrating structures integrally formed upon or within a back, radiation receiving, surface of the array. Each of the flux concentrating structures is in registration with at least one of the radiation detectors for concentrating optical flux thereon.

In accordance with another aspect of the invention there is disclosed a method of fabricating a back side illuminated focal plane array. The method includes a step of providing a substrate which is substantially transparent to radiation having wavelengths of interest and further includes a step of fabricating a plurality of optical flux concentrating structures upon or within a first surface of the substrate. Each of the flux concentrating structures is fabricated to be in registration with at least one radiation detector site disposed upon a second, opposite surface of the substrate for concentrating optical flux thereon.

In accordance with another aspect of the invention there is disclosed a method of fabricating a plurality of lens elements within a surface of a substrate. The method includes the steps of providing a substrate and preparing a surface layer of the substrate such that the surface layer has a faster lateral etch rate than the vertical etch rate of the substrate when exposed to an etchant. The method further includes a step of providing a mask over the surface of the substrate, the mask having a plurality of openings therethrough individual ones of which are located at a position where a lens element is desired. The method further includes the steps of applying an etchant to the surface of the substrate through the openings within the mask, etching the surface of the substrate such that a plurality of depressions are formed within the surface and depositing a layer of material over the surface of the substrate such that the depressions are filled with the material. The method includes an additional step of removing excess material from the surface of the substrate such that an upper surface of the material within the depressions is approximately coincident with the surface of the substrate, the material remaining within each of the depressions forming a lens element.

BRIEF DESCRIPTION OF THE DRAWING

The above set forth and other features of the invention will be made more apparent in the ensuing Detailed Description of the Invention when read in conjunction with the attached Drawing, wherein:

FIG. 1 is a top view of a back surface of a portion of a focal plane array of radiation detectors showing a plurality of integrally formed flux concentrating planoconvex lens elements;

FIG. 2 is a cross sectional view of the array taken along the section line 2—2 of FIG. 1;

FIG. 3 is a top view of a back surface of a portion of a focal plane array of radiation detectors showing an integrally formed flux concentrating Fresnel lens element;

FIG. 4 is a cross sectional view taken along the section line 4—4 of FIG. 3; and FIGS. 5a–5e illustrate consecutive steps of a method of the invention of fabricating one of the lens elements of FIGS. 1 and 2.

DETAILED DESCRIPTION OF THE INVENTION

Referring to FIGS. 1 and 2 there is shown a top view and a side cross-sectional view, respectively, of a focal plane array 10 of radiation detectors. Array 10 can be seen to be comprised of a plurality of detectors 12 which are formed adjacent to a front surface of a substrate 14, each of the detectors occupying a detector site. Substrate 14 is comprised of a semiconducting or insulating material which is substantially transparent to radiation having wavelengths of interest. By example, substrate 14 may be comprised of CdTe, CdZnTe, CdTeSe, Si, GaAs, InP or BaF. Further by example if comprised of CdTe the detectors 12 may be formed in a known manner within a relatively thin layer of mercury cadmium telluride (HgCdTe) deposited upon the front surface of substrate 14. Disposed on a back radiation receiving surface of the substrate 14 is, in accordance with the invention, a plurality of optical flux concentrating structures which, in the illustrated embodiment, have the form of plano-convex lens elements 16. Individual ones of the lens elements 16 are provided in registration with individual ones of the detectors 12 although it is within the scope of the invention to provide two or more detectors with a single lens element 16. Radiation, indicated by the arrows A, which is incident upon the back surface of the array 10 is concentrated upon an associated detector or detectors 12 by the lens 16. A ground metal contact 18 may be provided on the front surface of the array 10. Each of the detectors 12 typically has contact metallization and may be bumped with indium in order to couple the detectors to readout circuitry (not shown). A suitable anti-reflection coating (not shown) is typically also provided upon the back surface of the lens elements 16.

In accordance with the invention each of the lens elements 16 is integrally formed within the back surface of the substrate 14 and is comprised of a material having an index of refraction (n) which is greater than that of the material of substrate 14. By example, CdTe has an index of refraction of approximately 2.7. A suitable material for the lens 16 is Ge which has an index of refraction of approximately 4.0. Another suitable material is PbTe which has an index of refraction of approximately 6.0. Suitable lens materials for a BaF substrate are ZnSe or ZnS.

As an example, and for use with IR radiation having a wavelength of 10 microns, the substrate 14 has a thickness (t) of approximately 63 microns and each of the detectors 12 has a width (w1) of approximately 12 microns. Each of the lens elements 16 is comprised of Ge and has a width ($w_2$) of approximately 50 microns and a depth (d) of approximately 11 microns. Inasmuch as Ge has an index of refraction of approximately 4.0 and CdTe has an index of refraction of approximately 2.7 is has been found with this configuration that approximately 80% of the IR flux incident upon the lens 16 is concentrated upon the active area of the associated detector 12. In other words, the resulting electrical effect is as if the detector 12 has a significant larger area while still benefitting from the reduced capacitance and radiation hardness inherent in the reduced detector area and volume.

It should be noted that each of the lens elements 16 may be plano-convex with the convex side facing downwards (as shown) or upwards. Alternatively, the lens elements 16 may be double convex in shape.

Referring to FIGS. 3 and 4 there is shown another embodiment of the invention wherein the flux concentration structure of a focal plane array 20 is comprised of a plurality of concentric rings 22 which are formed on a back surface of a substrate 24 for focussing incident flux on a detector 26. The rings 22 form a Fresnel-type lens element and may be comprised of rings of metallization or dielectric which are fabricated with an overall width similar to that shown for the embodiment of FIGS. 1 and 2.

Referring now to FIGS. 5a–5e there is illustrated a presently preferred method of fabricating the downward facing plano-convex lens elements of FIGS. 1 and 2. Although the fabrication of one such lens element shown in FIGS. 5a–5b it should be realized that all of the lens elements for a given array are fabricated substantially simultaneously by this method. It should also be realized that the lens elements may be fabricated within the surface of the substrate before the fabrication of the detectors or after the fabrication of the detectors.

Referring first to FIG. 5a a substrate 30 is provided, such as a substrate comprised of CdTe or CdZnTe. A back, radiation receiving surface of the substrate 30 is ion implanted in order to induce implant damage to convert the crystalline structure to a substantially amorphous structure. Argon is one suitable implant source. The implant damage controls the lateral etch rate of the substrate in a subsequent processing step.

In FIG. 5b it can be seen that a suitably patterned mask layer 32 is deposited upon the back surface of the substrate 30, the mask layer 32 having openings for defining the individual ones of the lens elements. The mask layer 32 may comprise photoresist.

In FIG. 5c the back surface of the substrate 30 is preferentially etched by a chemical etchant, such as bromine, to create a lens shaped depression 34 within the back surface of the substrate 30. The implant damage previously induced causes the lateral etch rate of the substrate material to exceed the vertical etch rate, resulting in the formation of the relatively shallow and extended depression 34. It should be pointed out that a similar effect can be achieved by, instead of ion implanting the back surface as in FIG. 5a, depositing a thin layer of material which has a faster etch rate than the underlying substrate material.

In FIG. 5d it can be seen that the photoresist layer 34 is stripped away and a Ge coating 36 is evaporated upon the back surface of the substrate 30. As can be seen, the Ge is evaporated to a thickness such that the depression 34 is filled with Ge.

Referring to FIG. 5e it is shown that the back surface is smoothed such as by polishing or diamond turning the surface in order to remove the Ge layer 36 except for that portion which fills the depression 34. As can be seen, this results in the formation of the plano-convex lens 38. A subsequent step may involve the deposition of an anti-reflection coating upon the lens 38.

The Fresnel lens embodiment of FIGS. 3 and 4 is fabricated by providing a suitably patterned masking layer upon the back surface of the substrate and thereafter depositing a layer of metallization or dielectric within the patterned region. The masking layer is thereafter stripped away leaving the Fresnel lens structure upstanding on the back surface of the substrate. Alternatively, the mask may be used to etch the Fresnel structure into the substrate itself. The number of concentric ring structures is a function of processing limitations and may be more or less than the three concentric rings 22 shown in FIGS. 3 and 4.

In addition to providing for an increased fill factor in a reduced area type of focal plane array the invention furthermore provides for the operation of the array at higher temperatures. This is due to the flux concentrating structures also concentrating photon noise, while detector thermal noise is not affected. Thus, thermal noise can be increased, permitting operation at higher temperatures, in order to reach equivalent conventional detector thermal noise/photon noise levels. Other applications include longer wavelength operation at fixed temperatures and achieving a higher fill factor for applications where the front side area must be shared between detectors and other circuitry. Still further applications include the fabrication of detectors operated at room temperature with increased signal-to-noise ratios and the provision of a restricted field of view for detectors in order to substantially reduce the background photon noise floor.

While the invention has been particularly shown and described with respect to a preferred embodiment thereof, it will be understood by those skilled in the art that changes in form and details may be made therein without departing from the scope and spirit of the invention.

What is claimed is:

1. A back side illuminated focal plane array comprising a substrate comprised of group II–VI material having a first index of refraction and a plurality of radiation detectors disposed upon a front surface of the array, the array further comprising a plurality of optical flux concentrating structures integrally formed within a back, radiation receiving surface of the array, each of the flux concentrating structures being in registration with at least one of the radiation detectors or concentrating optical flux thereon, and wherein each of the flux concentrating structures comprises a lens element comprised of Ge or PbTe and having a second index of refraction that is larger in magnitude than the first index of refraction.

2. A method of fabricating a plurality of lens elements within a surface of a substrate, comprising the steps of:
providing a substrate;
preparing a surface of the substrate such that the surface has a faster lateral etch rate than a vertical etch rate when exposed to an etchant;
providing a mask over the surface of the substrate, the mask having a plurality of openings therethrough individual ones of which are located at a position where a lens element is desired;
applying an etchant to the surface of the substrate through the openings within the mask;
etching the surface of the substrate such that a plurality of depressions are formed within the surface;
depositing a layer of material over the surface of the substrate such that the depressions are filled with the material; and
removing excess material from the surface of the substrate such that the material remaining within each of the depressions forms a lens element.

3. A method as set forth in claim 2 wherein the step of preparing a surface includes a step of ion implanting the surface to induce implant damage therein.

4. A method as set forth in claim 2 wherein the step of preparing a surface includes a step of depositing a layer over the surface of the substrate, the deposited layer being comprised of a material selected to have a faster etch rate than the material of the substrate.

5. A method as set forth in claim 2 wherein the step of depositing a layer of material includes an initial step of selecting a material which has a greater index of refraction than a material which comprises the substrate.

6. A method as set forth in claim 2 wherein the step of removing includes a step of polishing the deposited layer to remove substantially all of the deposited material except for the material deposited within each of the depressions.

7. A method as set forth in claim 2 wherein the step of removing includes a step of diamond turning the deposited layer to remove substantially all of the deposited material except for the material deposited within each of the depressions.

8. A method as set forth in claim 2 and further comprising a step of depositing an anti-reflection coating at least upon exposed planar surfaces of the lens elements.

9. A method of fabricating a back side illuminated focal plane array comprising the steps of:
providing a substrate that is substantially transparent to radiation having wavelengths of interest, the substrate being comprised of material having a first index of refraction; and
fabricating a plurality of optical flux concentrating structures within a first surface of the substrate, each of the flux concentrating structures being fabricated to be in registration with at least one radiation detector site disposed upon or within a second, opposite surface of the substrate for concentrating optical flux thereon, wherein
for each of the optical flux concentrating structures the step of fabricating includes the steps of:
forming a concave region within the first surface; and
inserting within the concave region a material having a second index of refraction that is greater than the first index of refraction.

10. A method as set forth in claim 9 wherein the step of forming a concave region includes the steps of:
preparing the first surface of the substrate such that the first surface has a faster lateral etch rate than a vertical etch rate when exposed to an etchant;
providing a mask over the first surface of the substrate, the mask having a plurality of openings therethrough individual ones of which are located at a position where a flux concentrating structure is desired;
applying an etchant to the first surface of the substrate through the openings within the mask; and
etching the first surface of the substrate such that a plurality of the concave regions are formed within the first surface.

11. A method as set forth in claim 10 wherein the step of inserting includes the steps of:
depositing a layer of material over the first surface of the substrate such that the concave regions are filled with the material; and
removing excess material from the first surface of the substrate such that the material remaining within each of the concave regions forms a lens element.

12. A method as set forth in claim 10 wherein the step of preparing the first surface includes a step of ion implanting the first surface to induce implant damage therein.

13. A method as set forth in claim 10 wherein the step of preparing the first surface includes a step of depositing a layer over the first surface of the substrate, the deposited layer being comprised of a material selected to have a faster etch rate than the material of the substrate.

* * * * *